United States Patent
Kukulka

(10) Patent No.: US 6,784,358 B2
(45) Date of Patent: Aug. 31, 2004

(54) SOLAR CELL STRUCTURE UTILIZING AN AMORPHOUS SILICON DISCRETE BY-PASS DIODE

(75) Inventor: Jerry R. Kukulka, Santa Clarita, CA (US)

(73) Assignee: The Boeing Co., Seattle, WA (US)

( * ) Notice: Subject to any disclaimer, the term of this patent is extended or adjusted under 35 U.S.C. 154(b) by 11 days.

(21) Appl. No.: 10/291,350

(22) Filed: Nov. 8, 2002

(65) Prior Publication Data

US 2004/0089338 A1 May 13, 2004

(51) Int. Cl.[7] .................. H01L 31/05; H01L 3/0376
(52) U.S. Cl. .................. 136/244; 136/256; 136/258; 136/261; 136/252; 136/255; 136/249
(58) Field of Search .................. 136/256, 258, 136/261, 252, 255, 249, 244

(56) References Cited

U.S. PATENT DOCUMENTS

| | | | |
|---|---|---|---|
| 4,064,521 A | | 12/1977 | Carlson |
| 4,409,605 A | | 10/1983 | Ovshinsky et al. |
| 4,577,051 A | * | 3/1986 | Hartman ............ 136/244 |
| 4,638,109 A | * | 1/1987 | Ishihara et al. ........ 136/244 |
| 4,670,293 A | * | 6/1987 | Yamano et al. ........ 427/569 |
| 5,330,583 A | * | 7/1994 | Asai et al. ............ 136/251 |
| 5,330,585 A | | 7/1994 | Chang et al. |
| 5,616,185 A | * | 4/1997 | Kukulka ............ 136/244 |
| 6,034,322 A | * | 3/2000 | Pollard ............ 136/256 |
| 6,103,970 A | * | 8/2000 | Kilmer et al. ........ 136/252 |
| 6,184,458 B1 | * | 2/2001 | Murakami et al. ........ 136/256 |
| 6,278,054 B1 | * | 8/2001 | Ho et al. ............ 136/255 |
| 6,384,313 B2 | | 5/2002 | Nakagawa et al. |
| 2003/0075215 A1 | * | 4/2003 | Sharps et al. ........ 136/255 |

FOREIGN PATENT DOCUMENTS

JP     9-64397 A   *   3/1997

* cited by examiner

Primary Examiner—Alan Diamond

(57) ABSTRACT

A solar cell structure includes a solar cell that produces a voltage when illuminated, and a discrete amorphous silicon by-pass diode. A first by-pass diode terminal of the amorphous silicon by-pass diode is electrically connected to a first side of an active semiconductor structure of the solar cell, and a second by-pass diode terminal of the amorphous silicon by-pass diode is electrically connected to a second side of the active semiconductor structure. Alternatively, the first by-pass diode terminal of the amorphous silicon by-pass diode may be electrically connected to the first side of the active semiconductor structure of the solar cell, and the second by-pass diode terminal of the amorphous silicon by-pass diode may be electrically connected to a second side of the active semiconductor structure of another solar cell.

16 Claims, 3 Drawing Sheets

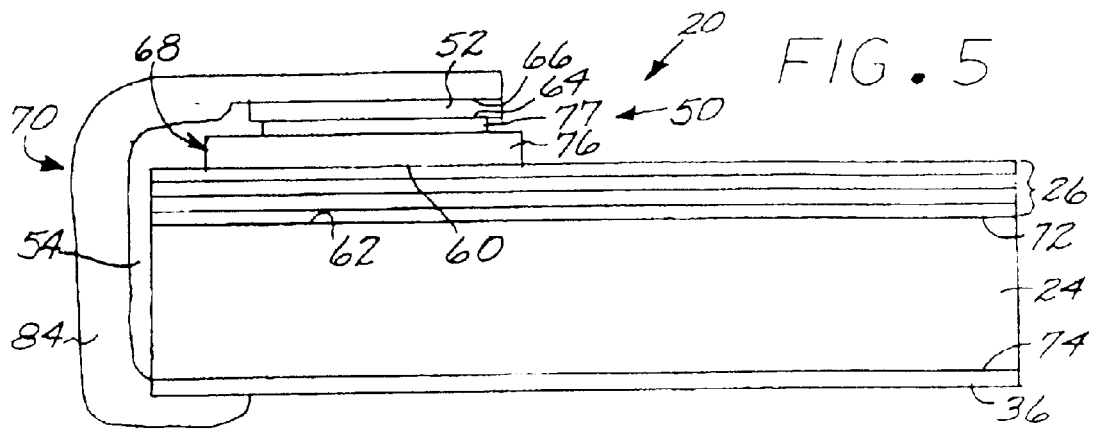
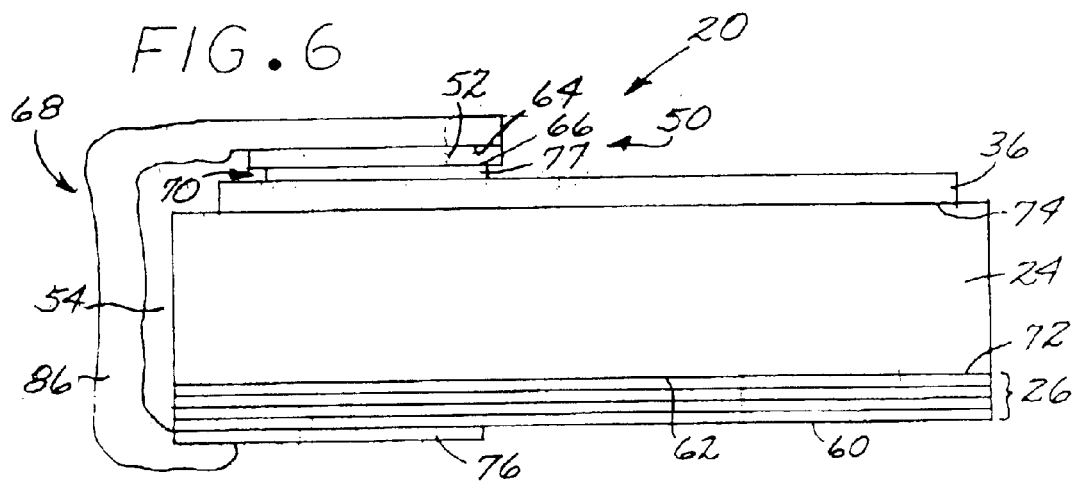
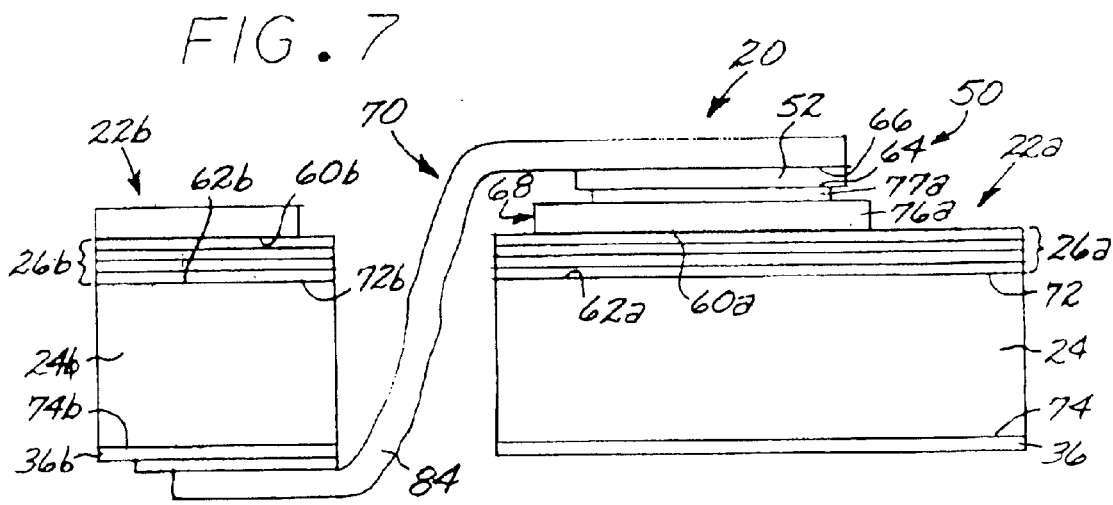

SOLAR CELL STRUCTURE UTILIZING AN AMORPHOUS SILICON DISCRETE BY-PASS DIODE

This invention relates to solar cell structures and, more particularly, to a solar cell using an amorphous silicon by-pass diode for reverse-bias protection.

BACKGROUND OF THE INVENTION

A solar cell is formed of two semiconductor layers in facing contact with each other at a semiconductor junction. When illuminated by the sun or otherwise, the solar cell produces a voltage between the semiconductor layers. Advanced solar cells may include more than two semiconductor layers and their respective pairwise semiconductor junctions. The various pairs of semiconductor layers of the advanced solar cells are tuned to the various spectral components of the sun to maximize the power output of the solar cell. The solar cells are made of layers of semiconductor materials that have low ductilities and are relatively brittle.

The voltage and current output of the solar cell are limited by the materials of construction and the surface area of the solar cell. Most commonly, a number of solar cells are electrically interconnected in series and/or parallel arrays to form a solar cell structure that produces higher voltages and/or higher currents than are possible with the single solar cell. Such solar cell structures are now used in both space and terrestrial applications.

The solar cell structure works well when all of the solar cells are illuminated with about the same illumination intensity. However, if one of the solar cells of the solar cell structure is shaded while the others remain fully illuminated, the shaded solar cell is subjected to a reverse-bias condition by the continuing voltage and current output of the remaining solar cells.

Fortunately, each solar cell may be protected against the damage arising during the reverse-bias condition by a parallel by-pass diode that does not pass current when the solar cell is not reverse biased, but passes the impressed current when the solar cell is reverse biased. The by-pass diode thus protects the individual cell against reverse-bias damage.

A number of by-pass diode configurations are in use and are operable, but each has its drawbacks. In one configuration, a discrete by-pass diode is bonded to the back side of the solar cell and interconnected to the semiconductor layers of the solar cell with leads. The discrete by-pass diode protrudes from the back of the solar cell and increases the likelihood that the solar cell will crack during handling or service. In another configuration, the by-pass diode is grown onto the front surface of the solar cell as part of the deposition process and then interconnected to the next cell in series. This approach is complex and causes assembly difficulties as well as reduced production yields and reduced solar cell efficiency. In yet another configuration, the by-pass diode is also grown into the front surface of the solar cell and interconnected with discrete or lithographic techniques. This approach is also complex, and has reduced production yields and reduced solar cell efficiency.

There is a need for an improved approach to the protection of solar cells against reverse-bias damage. The present invention fulfills this need, and further provides related advantages.

SUMMARY OF THE INVENTION

The present invention provides a solar cell structure comprising a solar cell protected against reverse-bias damage. The protection utilizes a discrete by-pass diode that is very thin so that it protrudes from the surface of the solar cell only a small distance. Consequently, it is less likely to lead to cracking of the solar cell than are conventional discrete by-pass diodes. The by-pass diode does not protrude from the sides of the solar cell.

A solar cell structure includes a solar cell that produces a voltage when illuminated, and a discrete amorphous silicon by-pass diode. A first by-pass diode terminal of the amorphous silicon by-pass diode is electrically connected to a first side of the active semiconductor structure of the solar cell, and a second by-pass diode terminal of the amorphous silicon by-pass diode is electrically connected to a second side of the active semiconductor structure. Alternatively, the first by-pass diode terminal of the amorphous silicon by-pass diode may be electrically connected to the first side of the active semiconductor structure of the solar cell, and the second by-pass diode terminal of the amorphous silicon by-pass diode may be electrically connected to a second side of the active semiconductor structure of another solar cell.

In accordance with the invention, a solar cell structure comprises a solar cell comprising an active semiconductor structure having a first active semiconductor structure side and a second active semiconductor structure side. There is typically a substrate having a first substrate side in contact with the second active semiconductor structure side and a second substrate side oppositely disposed to the first substrate side. The solar cell produces a voltage between the first active semiconductor structure side and the second active semiconductor structure side when illuminated. The solar cell structure further includes a by-pass diode structure comprising a discrete amorphous silicon by-pass diode, wherein the by-pass diode has a first by-pass diode terminal and a second by-pass diode terminal. A first electrical diode interconnection is in electrical communication between the first active semiconductor structure side and the first by-pass diode terminal. A second electrical diode interconnection is in electrical communication between the second active semiconductor structure side and the second by-pass diode terminal.

Preferably, the first electrical diode interconnection comprises a first-active-semiconductor-structure-side metallization in contact with the first active semiconductor structure side and with the first by-pass diode terminal. The by-pass diode is supported on the first-active-semiconductor-structure-side metallization.

In one embodiment, an electrically semiconductive substrate has a first substrate side comprising a contacting substrate portion that contacts the second active semiconductor structure side, and a noncontacting substrate portion that does not contact the second active semiconductor side. The second electrical diode interconnection is in electrical communication with the noncontacting substrate portion. The second electrical diode interconnection preferably comprises a second-interconnection lead extending between the noncontacting substrate portion and the second by-pass diode terminal.

In another embodiment, the solar cell further comprises a substrate having a first substrate side in contact with the second active semiconductor structure side and a second substrate side oppositely disposed to the first substrate side, and a back-side metallization in contact with the second substrate side. The first electrical diode interconnection comprises a first-active-semiconductor-structure-side metallization in contact with the first-active-semiconductor-structure-side metallization and with the first by-pass diode terminal, and the second electrical diode interconnection is in electrical communication between the back-side metallization and the second by-pass diode terminal. The second electrical diode interconnection desirably is a second-interconnection lead extending between the back-side metallization and the second by-pass diode terminal.

In another embodiment, the solar cell further comprises a substrate having a first substrate side in contact with the second active semiconductor structure side and a second substrate side oppositely disposed to the first substrate side, and a back-side metallization in contact with the second substrate side. The by-pass diode is supported on the back-side metallization. Desirably, the first electrical diode interconnection comprises a first-active-semiconductor-structure-side metallization contacting the first active semiconductor structure side and in electrical communication with the first by-pass diode terminal. The second electrical diode interconnection comprises a back-side metallization in contact with the second substrate side and with the second by-pass diode terminal. The second electrical diode interconnection is preferably a back-side metallization in contact with the second substrate side and with the second by-pass diode terminal.

The present approach may also be utilized by interconnecting two solar cells. In this approach, a solar cell structure comprises a first solar cell comprising a first-cell active semiconductor structure having a first-cell first active semiconductor structure side and a first-cell second active semiconductor structure side, wherein the solar cell produces a voltage between the first-cell first active semiconductor structure side and the first-cell second active semiconductor structure side when illuminated. There is additionally a second solar cell comprising a second-cell active semiconductor structure having a second-cell first active semiconductor structure side and a second-cell second active semiconductor structure side, wherein the solar cell produces a voltage between the second-cell first active semiconductor structure side and the second-cell second active semiconductor structure side when illuminated. The solar cell structure further includes a by-pass diode structure, wherein the by-pass diode structure comprises a discrete amorphous silicon by-pass diode, wherein the by-pass diode has a first by-pass diode terminal and a second by-pass diode terminal, a first electrical diode interconnection in electrical communication between the first-cell first active semiconductor structure side and the first by-pass diode terminal, and a second electrical diode interconnection in electrical communication between the second-cell second active semiconductor structure side and the second by-pass diode terminal.

In a preferred version of this multi-cell approach, the first electrical diode interconnection comprises a first-cell first-active-semiconductor-structure-side metallization in contact with the first-cell first active semiconductor structure side and with the first by-pass diode terminal. The second electrical diode interconnection comprises a second-interconnection lead. The second electrical diode interconnection further comprises a second-cell substrate having a second-cell substrate first side in contact with the second-cell second active semiconductor structure side, and an oppositely disposed second-cell substrate second side, a second-cell back-side metallization in contact with the second-cell substrate second side, and a second-interconnection lead extending between the second-cell back-side metallization and the second by-pass diode terminal.

The present approach thus provides a solar cell structure that uses a thin amorphous silicon by-pass diode for protection against reverse-bias damage. The thin by-pass diode protrudes very little from the surface of the solar cell, reducing the chances that it may be the origin of cracking and failure of the solar cell. Other features and advantages of the present invention will be apparent from the following more detailed description of the preferred embodiments, taken in conjunction with the accompanying drawings, which illustrate, by way of example, the principles of the invention. The scope of the invention is not, however, limited to these preferred embodiments.

BRIEF DESCRIPTION OF THE DRAWINGS

FIG. 5 is a sectional view of the solar cell structure of FIG. 1, taken along line 4—4 of FIG. 1 and showing a second embodiment of the by-pass diode structure;

FIG. 6 is a sectional view of the solar cell structure of FIG. 1, taken along line 4—4 of FIG. 1 and showing a third embodiment of the by-pass diode structure; and FIG. 7 is a sectional view of the solar cell structure of FIG. 1, taken along line 7—7 of FIG. 1 and showing a fourth embodiment of the by-pass diode structure.

DETAILED DESCRIPTION OF THE INVENTION

Figure 1:
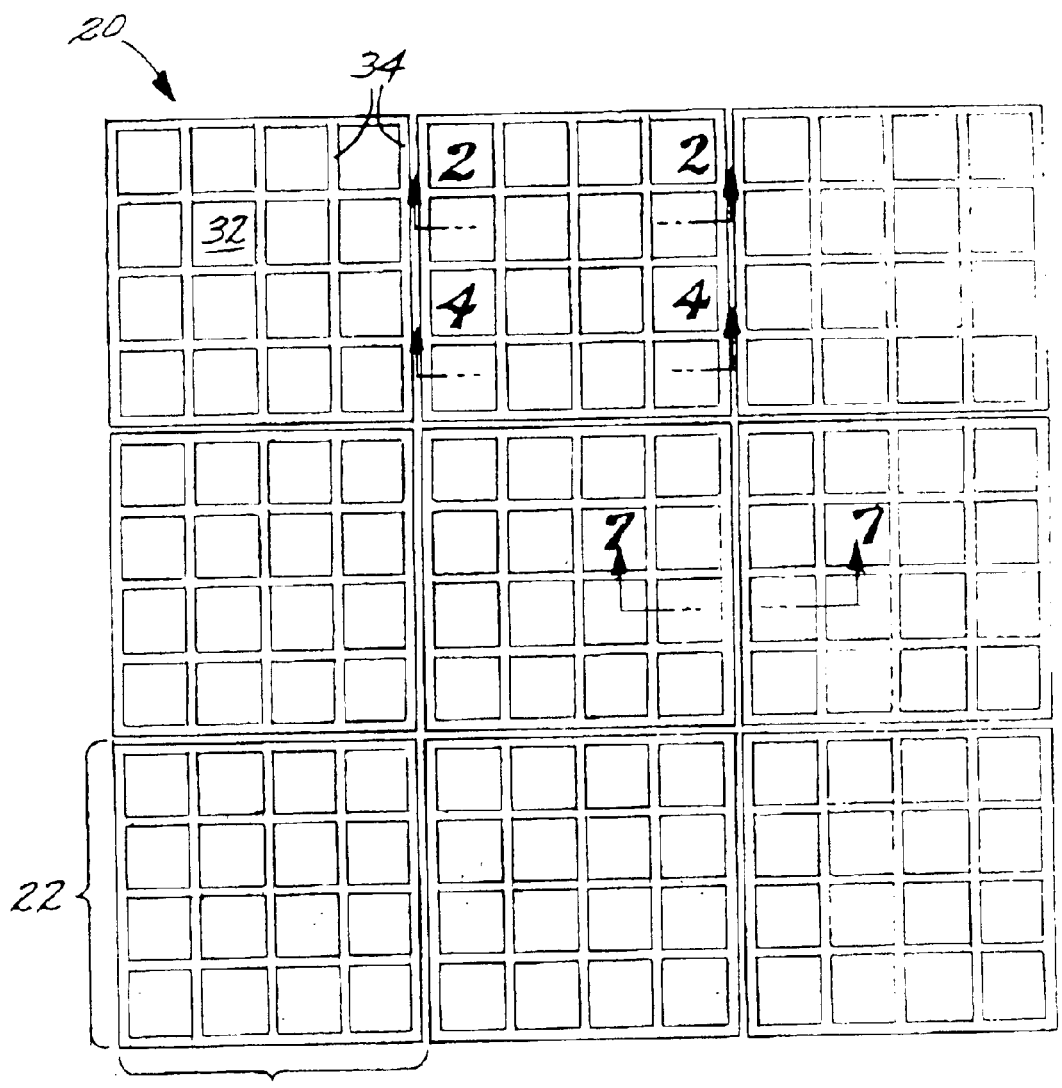
FIG. 1 is a plan view of a solar cell structure.
Figure 2:
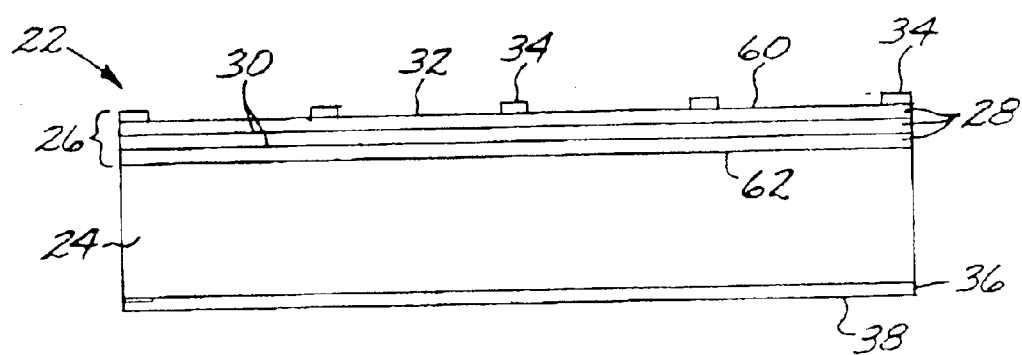
FIG. 2 is a sectional view of the solar cell structure of FIG. 1, taken along line 2—2 of FIG. 1 and not showing any of the by-pass diode structure.

FIGS. 1–2 depict a solar cell structure 20 made up of individual solar cells 22 electrically connected in a series and/or parallel electrical array. In FIG. 1, a plan view from the front (illuminated) side of the solar cell structure 20, nine solar individual solar cells 22 are shown, but typically there are many more in the array.

FIG. 2 illustrates one of the solar cells 22 in sectional view, without any portion of a by-pass diode structure shown. The solar cell 22 includes a substrate 24 and an active semiconductor structure 26 contacting the substrate 24. The substrate 24 and the active semiconductor structure 26 is made of electrically semiconducting materials. The active semiconductor structure 26 includes at least two semiconductor layers 28 in facing contact with each other to form at least one semiconductor junction 30 (and in the illustrated case, three semiconductor layers 28 having two semiconductor junctions 30) producing a voltage between the semiconductor layers 28 when illuminated from a front side 32 of the solar cell 22. There is a front side metallization 34 in the form of metallic stripes overlying the front side 32 of the solar cell. An oppositely disposed back-side metallization 36 in the form of a metallic layer overlies an oppositely disposed back side 38 of the solar cell 22. The front-side metallization 34 and the back-side metallization 36 collect a solar-cell electrical current resulting from the voltage produced by the semiconductor junction(s) 30. The solar cells 22 are usually electrically connected to each other by electrical connections not visible in FIGS. 1–2 in a series and/or parallel array to produced a required voltage and current output of the solar cell array 20.

Figure 3:
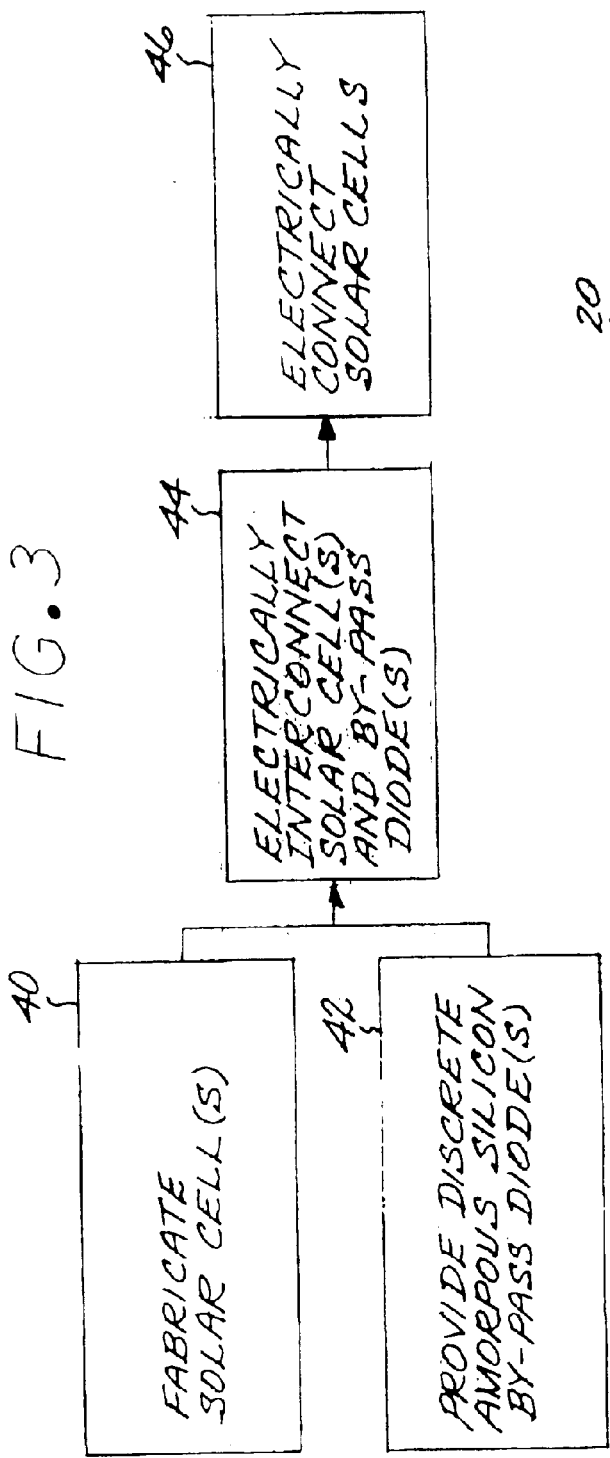
FIG. 3 is a block flow diagram of an approach for preparing a solar cell structure protected by a by-pass diode.

FIG. 3 depicts an approach for fabricating a solar cell structure 20 protected by a by-pass diode structure. Solar cell(s) 22 like that described above are fabricated, step 40. Such solar cells 22 are known in the art, and their structure and fabrication are described, for example, in U.S. Pat. No. 5,330,585, whose disclosure is incorporated by reference.

The solar cell structure 20 further includes a by-pass diode structure 50 utilizing discrete amorphous silicon by-pass diodes 52. Four embodiments of the by-pass diode structure 50 with discrete amorphous silicon by-pass diodes 52 are illustrated in FIGS. 4–7. In FIGS. 4–7, the solar cell 22 is illustrated generically, without showing the substrate and active semiconductor structure. In FIGS. 1–2 and 4–7, common elements of structure are assigned the same reference numerals, and the discussion is incorporated into each of the descriptions. Various configurations of solar cells, amorphous silicon by-pass diodes, and electrical interconnections are illustrated in FIGS. 1–2 and 4–7, and the various features may be used interchangeably to the extent that they are compatible. In normal practice, a single type of by-pass diode structure 50 would be used for all of the diodes of the solar cell structure 20 for manufacturing simplicity, but the different embodiments are shown in FIGS. 1–2 and 4–7 to illustrate some of the possible approaches.

The discrete amorphous silicon by-pass diodes 52 are provided, step 42. Such amorphous silicon by-pass diodes 52 are "discrete" because they exist and are provided separately from the solar cells 22, and are not deposited integrally with the solar cells 22. This distinction is important because the solar cells need not be specially modified to allow an integral by-pass diode to be present, as in some other approaches to by-pass diodes that are not within the scope of the invention. The by-pass diodes 52 comprise "amorphous" silicon rather than crystalline silicon. Normally, when a diode is described as a "silicon diode", it is understood to be a crystalline silicon diode unless specified to the contrary as an "amorphous silicon diode". In the present case, the by-pass diode 52 may not be a crystalline silicon diode and it may not be integral with the solar cell. An important feature of the discrete amorphous silicon by-pass diode is that it is very thin, typically on the order of about 2–3 micrometers thick. By contrast, a discrete crystalline silicon diode is typically about 75 micrometers thick. The diode performance of the 2–3 micrometer-thick discrete amorphous by-pass diode is usually not quite as good as that of the 75 micrometer-thick discrete crystalline by-pass diode, but it is sufficient for the solar cell application. Discrete amorphous silicon by-pass diodes are known in the art for other applications, and their structure is described, for example, in U.S. Pat. Nos. 4,064,521 and 4,409,605, whose disclosures are incorporated by reference.

The solar cells 22 and the amorphous silicon by-pass diodes are electrically interconnected, step 44, and the solar cells 22 are electrically connected, step 46. The steps 44 and 46 may be performed sequentially in the order shown, sequentially in reverse order, or in an interspersed, simultaneous fashion.

In all of the embodiments, the active semiconductor structure 26 has a first active semiconductor structure side 60 (that is usually coincident with the directly illuminated front side 32 of the solar cell 22) and a second active semiconductor structure side 62. The amorphous silicon by-pass diode 52 has a first by-pass diode terminal 64 and a second by-pass diode terminal 66. In most instances of amorphous silicon-by-pass diodes 52 that are presently available, the diode terminals 64 and 66 are oppositely disposed parallel sides or faces of the thin amorphous by-pass diode 52 to which electrical contact is directly made. However, "diode terminals" is used here in a more general sense to permit the location of the electrical interconnections to the by-pass diode to be discrete terminals or other types of electrical interconnections as well. In the illustrated embodiments of FIGS. 4–6 wherein the amorphous silicon by-pass diode 52 is interconnected with a single solar cell 22, a first electrical diode interconnection 68 is in electrical communication between the first active semiconductor structure side 60 and the first by-pass diode terminal 64; and a second electrical diode interconnection 70 is in electrical communication between the second active semiconductor structure side 62 and the second by-pass diode terminal 66. In each case, the electrical communication may be direct or indirect through another element having sufficient electrical conductivity. These embodiments of FIGS. 4–6 differ according to the manner in which the amorphous silicon by-pass diode 52 and the electrical diode interconnections 68 and 70 are accomplished. The substrate 24 may be described as having a first substrate side 72 in contact with the second active semiconductor structure side 62, and a second substrate side 74 oppositely disposed to the first substrate side 72 and which is contacted by the back-side metallization 36.

Figure 4:
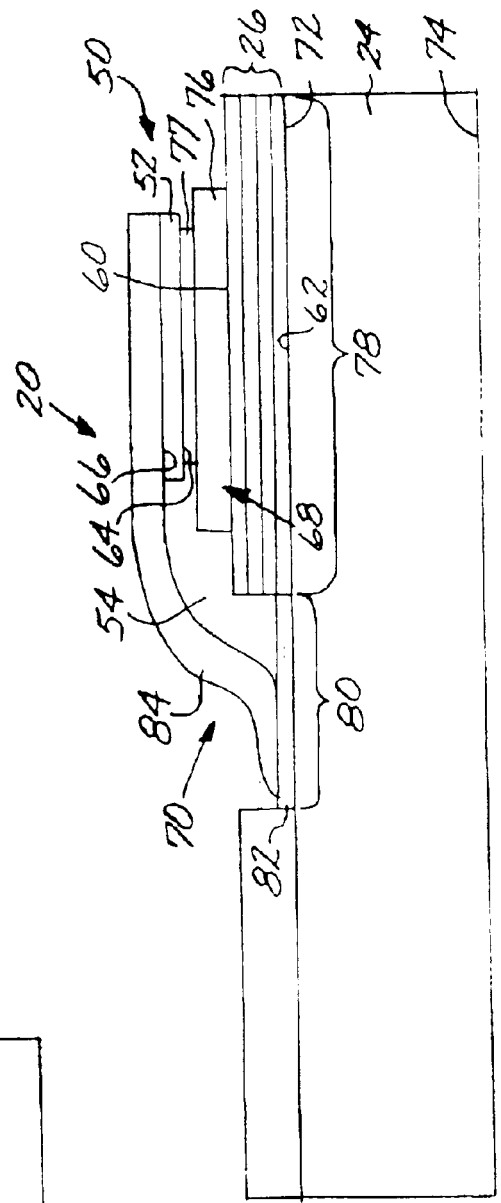
FIG. 4 is a sectional view of the solar cell structure of FIG. 1, taken along line 4—4 of FIG. 1 and showing a first embodiment of the by-pass diode structure.

In the presently most-preferred embodiment of FIG. 4, the first electrical diode interconnection 68 comprises a first-active-semiconductor-structure-side metallization 76 in contact with the first active semiconductor structure side 60 and with the first by-pass diode terminal 64. The by-pass diode 52 is supported on the first-active-semiconductor-structure-side metallization 76 and bonded thereto with a solder layer 77. Further in this embodiment, the first substrate side 72 of the electrically semiconductive substrate 24 has a contacting substrate portion 78 that contacts the second active semiconductor structure side 62, and a noncontacting substrate portion 80 that does not contact the second active semiconductor side 62. The second electrical diode interconnection 70 is in electrical communication with the noncontacting substrate portion 80, preferably with a noncontacting-portion metallization 82 deposited upon and in contact with the noncontacting substrate portion 80, and a second-interconnection lead 84 extending between the noncontacting-portion metallization 82 and the noncontacting substrate portion 80, on the one hand, and the second by-pass diode terminal 66 on the other. In the embodiment of FIG. 4, as well as the embodiments of FIGS. 5–6, suitable insulation 54 is provided to prevent the electrically conducting leads from contacting and shorting to the remainder of the structure.

In the embodiment of FIG. 5, the first electrical diode interconnection 68 comprises the first-active-semiconductor-structure-side metallization 76 in electrical contact with the first active semiconductor structure side 60 and with the first by-pass diode terminal 64. The by-pass diode 52 is supported on the first-active-semiconductor-structure-side metallization 76 and bonded thereto by the solder layer 77. The second electrical diode interconnection 70 is in electrical communication between the back-side metallization 36 and the second by-pass diode terminal 66, preferably with the second interconnection lead 84 extending between the back-side metallization 36 and the second by-pass diode terminal 66.

In the embodiment of FIG. 6, the by-pass diode 52 is supported on the back-side metallization 36 and bonded thereto by the solder layer 77. The first electrical diode interconnection 68 comprises a first-active-semiconductor-structure-side metallization 76 contacting the first active semiconductor structure side 60 and in electrical communication with the first by-pass diode terminal 64, preferably with a first interconnection lead 86 extending between the first-active-semiconductor-structure-side metallization 76 and the first by-pass diode terminal 64. The second electrical diode interconnection 70 comprises the back-side metallization 36 in contact with the second substrate side 74 and with the second by-pass diode terminal 66 through the solder layer 77.

In another embodiment, here illustrated in FIG. 7, the amorphous silicon by-pass diode 52 is connected between two solar cells 22*a* and 22*b*. The solar cell structure 20 comprises the first solar cell 22*a* comprising a first-cell active semiconductor structure 26*a* having a first-cell first active semiconductor structure side 60*a* and a first-cell second active semiconductor structure side 62*a*. The second solar cell 22*b* comprises a second-cell active semiconductor structure 26*b* having a second-cell first active semiconductor structure side 60*b* and a second-cell second active semiconductor structure side 62*b*. The by-pass diode structure 50 comprises the discrete amorphous silicon by-pass diode 52 having the first by-pass diode terminal 64 and the second by-pass diode terminal 66. The first electrical diode interconnection 68 is in electrical communication between the first-cell first active semiconductor structure side 60*a* and the first by-pass diode terminal 64, preferably through a first-cell first-active-semiconductor-structure-side metallization 76*a*. Preferably and as illustrated, the by-pass diode 52 is supported on the first-cell first-active-semiconductor-structure-side metallization 76*a* and bonded thereto with a first-cell solder layer 77*a*. The second electrical diode interconnection 70 is in electrical communication between the second-cell second active semiconductor structure side 62*b* (through the substrate 24*b*) and the second by-pass diode terminal 66. In the preferred approach, the second electrical diode interconnection 70 includes an electrically semiconducting second-cell substrate 24*b* having a second-cell first-substrate side 72*b* contacting the second-cell second active semiconductor structure side 62*b*, and a second-cell back-side metallization 36*b* deposited upon an oppositely disposed second-cell second-substrate side 74*b*. The second-interconnection lead 84 extends between the second-cell back-side metallization 36*b* and the second by-pass diode terminal 66.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A solar cell structure comprising:
   a solar cell comprising an active semiconductor structure having a first active semiconductor structure side and a second active semiconductor structure side, wherein the solar cell produces a voltage between the first active semiconductor structure side and the second active semiconductor structure side when illuminated; and
   a by-pass diode structure, wherein the by-pass diode structure comprises
      a discrete amorphous silicon by-pass diode, wherein the by-pass diode has a first by-pass diode terminal and a second by-pass diode terminal,
      a first electrical diode interconnection in electrical communication between the first active semiconductor structure side and the first by-pass diode terminal, and
      a second electrical diode interconnection in electrical communication between the second active semiconductor structure side and the second by-pass diode terminal.

2. The solar cell structure of claim 1, wherein the solar cell further comprises
   a substrate having a first substrate side in contact with the second active semiconductor structure side and a second substrate side oppositely disposed to the first substrate side.

3. The solar cell structure of claim 1, wherein
   the first electrical diode interconnection comprises a first-active-semiconductor-structure-side metallization in contact with the first active semiconductor structure side and with the first by-pass diode terminal, and wherein
   the by-pass diode is supported on the first-active-semiconductor-structure-side metallization.

4. The solar cell structure of claim 1, wherein the solar cell further comprises
   an electrically semiconductive substrate having a first substrate side comprising
      a contacting substrate portion that contacts the second active semiconductor structure side, and
      a noncontacting substrate portion that does not contact the second active semiconductor structure side,
   wherein the second electrical diode interconnection is in electrical communication with the noncontacting substrate portion.

5. The solar cell structure of claim 1, wherein the solar cell structure further comprises
   an electrically semiconductive substrate having a first substrate side comprising
      a contacting substrate portion that contacts the second active semiconductor structure side, and
      a noncontacting substrate portion that does not contact the second active semiconductor structure side,
   wherein the second electrical diode interconnection comprises a second-interconnection lead extending between the noncontacting substrate portion and the second by-pass diode terminal.

6. The solar cell structure of claim 1, wherein the solar cell further comprises
   a substrate having a first substrate side in contact with the second active semiconductor structure side and a second substrate side oppositely disposed to the first substrate side, and
   a back-side metallization in contact with the second substrate side,
   wherein
   the first electrical diode interconnection comprises a first-active-semiconductor-structure-side metallization in contact with the first-active-semiconductor-structure-side metallization and with the first by-pass diode terminal, and
   the second electrical diode interconnection is in electrical communication between the back-side metallization and the second by-pass diode terminal.

7. The solar cell structure of claim 1, wherein the solar cell further comprises
   a substrate having a first substrate side in contact with the second active semiconductor structure side and a second substrate side oppositely disposed to the first substrate side, and
   a back-side metallization in contact with the second substrate side,
   wherein
   the first electrical diode interconnection comprises a first-active-semiconductor-structure-side metallization in contact with the first-active-semiconductor-structure-side metallization and with the first by-pass diode terminal, and the second electrical diode interconnection comprises a second-interconnection lead extending between the back-side metallization and the second by-pass diode terminal.

8. The solar cell structure of claim 1, wherein the solar cell further comprises a substrate having a first substrate side in contact with the second active semiconductor structure side and a second substrate side oppositely disposed to the first substrate side, and a back-side metallization in contact with the second substrate side, and wherein the by-pass diode is supported on the back-side metallization.

9. The solar cell structure of claim 1, wherein the solar cell further comprises a substrate having a first substrate side in contact with the second active semiconductor structure side and a second substrate side oppositely disposed to the first substrate side, wherein the first electrical diode interconnection comprises a first-active-semiconductor-structure-side metallization contacting the first active semiconductor structure side and in electrical communication with the first by-pass diode terminal, and the second electrical diode interconnection comprises a back-side metallization in contact with the second substrate side and with the second by-pass diode terminal.

10. The solar cell structure of claim 1, wherein the solar cell further comprises a substrate having a first substrate side in contact with the second active semiconductor structure side and a second substrate side oppositely disposed to the first substrate side, wherein the first electrical diode interconnection comprises a first-active-semiconductor-structure-side metallization contacting the first active semiconductor structure side, and a first-interconnection lead extending between the first-active-semiconductor-structure-side metallization and the first by-pass diode terminal, and the second electrical diode interconnection comprises a back-side metallization in contact with the second substrate side and with the second by-pass diode terminal.

11. A solar cell structure comprising:

a first solar cell comprising a first-cell active semiconductor structure having a first-cell first active semiconductor structure side and a first-cell second active semiconductor structure side, wherein the solar cell produces a voltage between the first-cell first active semiconductor structure side and the first-cell second active semiconductor structure side when illuminated;

a second solar cell comprising a second-cell active semiconductor structure having a second-cell first active semiconductor structure side and a second-cell second active semiconductor structure side, wherein the solar cell produces a voltage between the second-cell first active semiconductor structure side and the second-cell second active semiconductor structure side when illuminated; and a by-pass diode structure, wherein the by-pass diode structure comprises a discrete amorphous silicon by-pass diode, wherein the by-pass diode has a first by-pass diode terminal and a second by-pass diode terminal, a first electrical diode interconnection in electrical communication between the first-cell first active semiconductor structure side and the first by-pass diode terminal, and a second electrical diode interconnection in electrical communication between the second-cell second active semiconductor structure side and the second by-pass diode terminal.

12. The solar cell structure of claim 11, wherein the first electrical diode interconnection comprises a first-cell first-active-semiconductor-structure-side metallization in contact with the first-cell first active semiconductor structure side and with the first by-pass diode terminal.

13. The solar cell structure of claim 11, wherein the second electrical diode interconnection comprises a second-interconnection lead.

14. The solar cell structure of claim 11, wherein the second electrical diode interconnection comprises a second-cell substrate having a second-cell first substrate side in contact with the second-cell second active semiconductor structure side, and an oppositely disposed second-cell second substrate side, a second-cell back-side metallization in contact with the second-cell second substrate side, and a second-interconnection lead extending between the second-cell back-side metallization and the second by-pass diode terminal.

15. The solar cell structure of claim 1, wherein the by-pass diode is about 2–3 micrometers thick.

16. A solar cell structure comprising:

a solar cell comprising an active semiconductor structure having a first active semiconductor structure side and a second active semiconductor structure side, wherein the solar cell produces a voltage between the first active semiconductor structure side and the second active semiconductor structure side when illuminated; and a by-pass diode structure, wherein the by-pass diode structure comprises an amorphous silicon by-pass diode, wherein the by-pass diode exists separately from the solar cell, wherein a structure of the by-pass diode is not integral with a structure of the solar cell, and wherein the by-pass diode has a first by-pass diode terminal and a second by-pass diode terminal, a first electrical diode interconnection in electrical communication between the first active semiconductor structure side and the first by-pass diode terminal, and a second electrical diode interconnection in electrical communication between the second active semiconductor structure side and the second by-pass diode terminal.

* * * * *